(12) United States Patent
Shah et al.

(10) Patent No.: US 9,294,098 B2
(45) Date of Patent: Mar. 22, 2016

(54) SYSTEM AND METHOD FOR ON DEMAND, VANISHING, HIGH PERFORMANCE ELECTRONIC SYSTEMS

(71) Applicant: Lawrence Livermore National Security, LLC, Livermore, CA (US)

(72) Inventors: Kedar G. Shah, San Francisco, CA (US); Satinderpall S. Pannu, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 304 days.

(21) Appl. No.: 14/090,004

(22) Filed: Nov. 26, 2013

(65) Prior Publication Data

US 2015/0145590 A1    May 28, 2015

(51) Int. Cl.
*H03K 19/17* (2006.01)
*H03K 19/177* (2006.01)

(52) U.S. Cl.
CPC ............................... *H03K 19/17768* (2013.01)

(58) Field of Classification Search
CPC ...................................................... H03K 19/17
See application file for complete search history.

(56) References Cited

U.S. PATENT DOCUMENTS

| 3,882,324 A * | 5/1975 | Smolker ................. F41H 13/00 |
|||102/202.5|
| 8,403,915 B2 | 3/2013 | Santini, Jr. et al. |
| 2013/0140649 A1 | 6/2013 | Rogers et al. |

* cited by examiner

*Primary Examiner* — Hai L Nguyen
(74) *Attorney, Agent, or Firm* — Harness, Dickey & Pierce, PLC

(57) ABSTRACT

An integrated circuit system having an integrated circuit (IC) component which is able to have its functionality destroyed upon receiving a command signal. The system may involve a substrate with the IC component being supported on the substrate. A module may be disposed in proximity to the IC component. The module may have a cavity and a dissolving compound in a solid form disposed in the cavity. A heater component may be configured to heat the dissolving compound to a point of sublimation where the dissolving compound changes from a solid to a gaseous dissolving compound. A triggering mechanism may be used for initiating a dissolution process whereby the gaseous dissolving compound is allowed to attack the IC component and destroy a functionality of the IC component.

22 Claims, 12 Drawing Sheets

| TABLE 1: COMPARISON OF TRANSIENT PROPERTIES OF MATERIALS IN TRADITIONAL INTEGRATED CIRCUITS | | | | |
|---|---|---|---|---|
| MATERIAL | TRADITIONAL INTEGRATED CIRCUITS | TRANSIENT IN XENON DIFLUORIDE | NEW MATERIAL | TRANSIENT IN XENON DIFLUORIDE |
| SUBSTRATE | Si | YES | | YES |
| SEMICONDUCTOR | n-,p-doped Si | YES | | YES |
| FIELD OXIDE | THERMAL SiO2 | NO | | POSSIBLE, BUT REMNANTS NOT VISIBLE |
| GATE OXIDE | DOPED SiO2 | NO | | POSSIBLE, BUT REMNANTS NOT VISIBLE |
| METALLIZATION | Al-Cu ALLOY | NO | W | YES |
| INTERLAYER DIELECTRIC | DOPED SiO2 | NO | SILICON NITRIDE ($Si_3N_4$) OR DOPED-GLASS | YES |
| BARRIER LAYER | TiN, TaN | YES | | YES |
| ADHESION LAYER | Ti | YES | | YES |

FIGURE 2

| Active Components | Passive Components |
|---|---|
| MOS Transistors | Capacitors |
| RF Transistors | Inductors |
| Bipolar Transistors | Resistors |
|  | Conductors |
|  | Varactors |
|  | RF Varactors |
|  | Diodes |

FIGURE 4

Table 3. Xenon difluoride required to etch a given amount of Si, $Si_3N_4$ and W.

| Target | Balanced Equations | Mass Ratio | Volume Ratio |
|---|---|---|---|
| Si | $2XeF_2 + Si \rightarrow 2Xe + SiF_4$ | 12.14 | 6.5 |
| $Si_3N_4$ | $6XeF_2 + Si_3N_4 \rightarrow 6Xe + 3SiF_4 + 2N_2$ | 7.23 | 5.76 |
| W | $3XeF_2 + W \rightarrow 3Xe + WF_6$ | 2.59 | 9.37 |

FIGURE 7

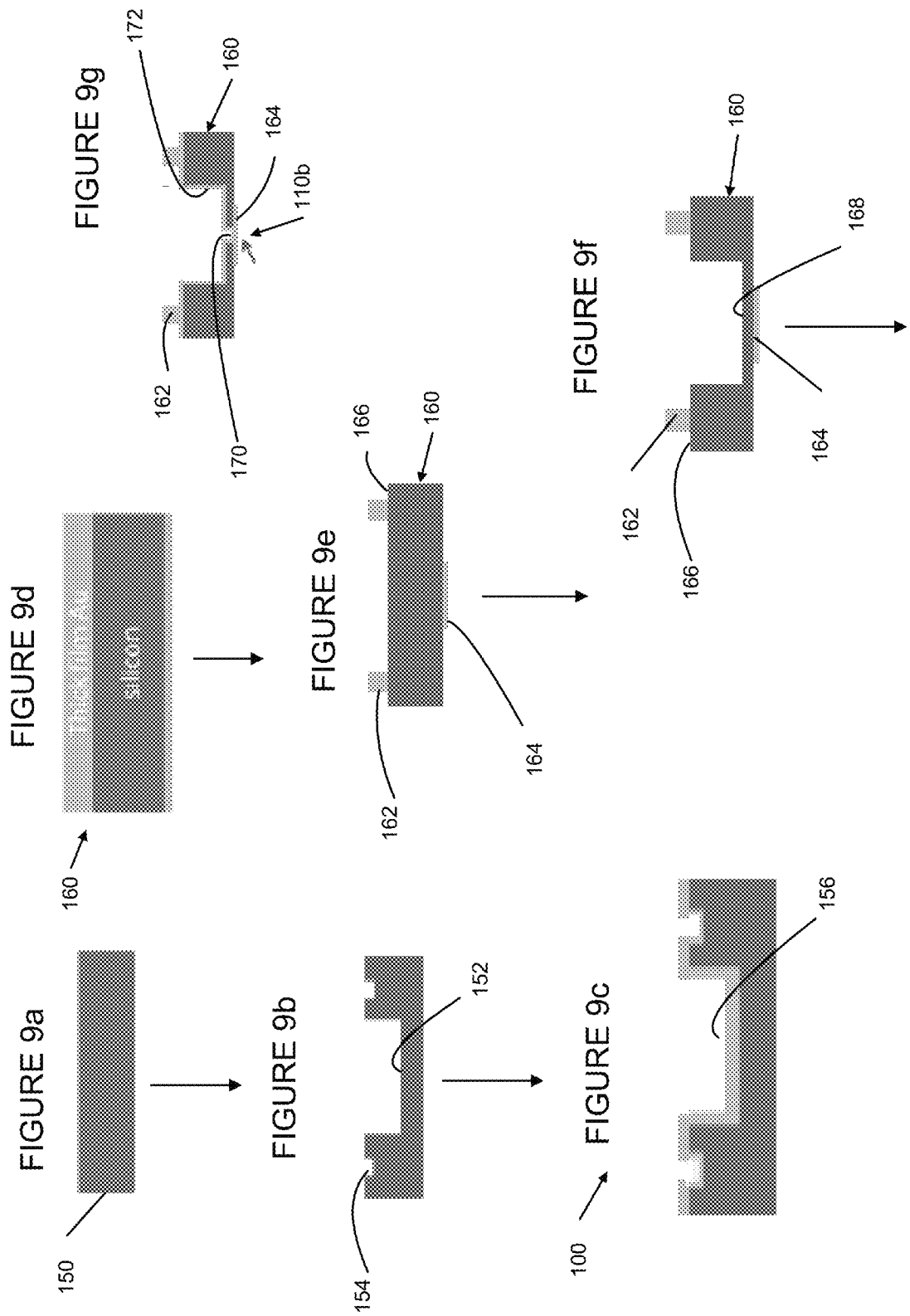

SYSTEM AND METHOD FOR ON DEMAND, VANISHING, HIGH PERFORMANCE ELECTRONIC SYSTEMS

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to electronic systems, and more particularly to a system that is able to create a dissolving agent and to release the dissolving agent to partially or completely rapidly dissolve an integrated circuit or to otherwise destroy a functionality of the integrated circuit, upon receiving a suitable triggering signal.

BACKGROUND

The statements in this section merely provide background information related to the present disclosure and may not constitute prior art.

Complex electronic systems employing integrated circuits are now manufacturable at sufficiently low cost that they are widely used in distributed remote sensing and various communications systems. With this development has come an increasing challenge in tracking and/or recovering such devices from the environment in which they are being used. As such, these devices may be left in the environment after their functionality has been destroyed or impaired. Accordingly, there is an increasing interest in developing electronic systems, and particularly integrated circuits, which can be destroyed upon a triggering event, and such that little or no trace of the physical materials that were used to form the circuit are left behind after the circuit is destroyed.

One important objective relating to the above-mentioned goal is developing and establishing a base set of materials, components, integration, and manufacturing capabilities to undergird this new class of electronics. An important overall objective is to develop fully transient electronic systems with performance equivalent to state of the art electronics manufactured for applications such as present day smartphones, personal computers, computing tablets, and other high performance electronics. The approach should leverage present day semiconductor technologies used to manufacture high performance electronics such as the Intel Pentium® microprocessor. The co-inventors of the subject matter of the present application are not aware of any transient electronics available which can match the performance available from the commercial microelectronics industry.

It is also important to recognize that interest in the field of transient electronics has grown over the past several years, with the most notable recent advancements being developed by Dr. John Rogers at the University of Illinois at Urbana Champaign. His Science paper in 2012 titled "A Physically Transient Form of Silicon Electronics" (link: http://www-.sciencemag.org/content/337/6102/1640) and his more recent paper in Advanced Materials titled "Materials for Bioresorbable Radio Frequency Electronics" (link: http://onlinelibrary.wiley.com/doi/10.1002/adma.201300920/abstract) increased the interest and momentum in this field. In his approach, Dr. Rogers has developed electronic components which are dissolvable in water. Using ultra-thin silicon (~35 nm), silicon dioxide, magnesium, magnesium oxide, and synthetic silk as a substrate, Dr. Rogers has demonstrated basic electronic functions performed by components such as resistors, diodes, and a RF antenna which are inherently transient. Using these components, Dr. Rogers has demonstrated simple electronic systems and components. However, the performance of these systems and components is significantly below the electronics which are able to be manufactured by present day semiconductor processes.

There has also been significant interest in the medical community and the commercial sector for circuits that can essentially "disappear" over time or by activation from a suitable signal or command. High-performance, organic, thin-film transistor arrays have been fabricated on paper which offer a compostable, low cost, disposable platform. Transient electronics can be applied to implantable biomedical devices or for the protection of sensitive property. There are several FDA-approved biodegradable polymers, such as polylactic acid and polycaprolactone, which are used to contain and package implantable electronics. Other biodegradable and biocompatible polymers include copolymers of polyglycolic acid and polyanhydrides. Silk has become a popular substrate of choice for thin-film bioelectronics due to its biocompatibility, solubility and amenability to functionalization. For conductive components, biodegradable metals such as magnesium and iron have been demonstrated in stent applications. Wireless RF pressure sensors made with biodegradable polymer and zinc have been microfabricated using MEMS technologies. As interest in more complex transient circuits increases, more research is being placed in the manufacturing and material sets required. As pointed out by Dr. Rogers and others in the field, silicon is inherently a transient material. Its rate of dissolution depends on specific environmental conditions. For example, silicon is etched extremely slowly in water (e.g., a few nanometers per day at room temperature) and much more quickly in other aqueous media such as potassium hydroxide (micrometers per minute at room temperature). However, both of these approaches have several disadvantages which preclude them being used on typical silicon microelectronics. Typical packaged silicon microelectronics are approximately 250-700 micrometers thick and contain many different materials such as silicon, silicon dioxide, silicon nitride, aluminum, gold, copper, tungsten and various polymers. A typical cross section of an NMOS transistor is shown in FIG. 1. As shown in FIG. 1, a majority of the transistor is silicon including the polysilicon for the first layer of transistor interconnects. A field oxide which is thermally grown silicon dioxide passivation (~100 nm to 500 nm) passivate the devices. On top of the field oxide is a number of layers used to interconnect the devices. These interconnect layers consist of a passivation layer and metal layers. The passivation layer is typically silicon dioxide and the metal layer is typically copper or aluminum.

Under typically conditions, the above mentioned aqueous solutions do not dissolve all of these materials, and the materials which do dissolve do not do so in a reasonable length of time. More importantly, a reservoir is required to store the aqueous solution. The use of a fluid reservoir is not practical in many, if not most, instances. Furthermore, the use of a reservoir is easily defeatable.

SUMMARY

In one aspect the present disclosure relates to an integrated circuit system having an integrated circuit (IC) component which is able to have its functionality destroyed upon receiving a command signal. The system may involve a substrate with the IC component being supported on the substrate. A module may be disposed in proximity to the IC component. The module may have a cavity and a dissolving compound in a solid form disposed in the cavity. A heater component may be configured to heat the dissolving compound to a point of sublimation where the dissolving compound changes from a solid to a gaseous dissolving compound. A triggering mechanism may be used for initiating a dissolution process whereby the gaseous dissolving compound is allowed to attack the IC component and destroy a functionality of the IC component.

In another aspect the present disclosure relates to a module adapted for destroying a functionality of an integrated circuit component upon receipt of a command signal. The module may comprise a hermetically sealed housing having a cavity and being disposed in proximity to the integrated circuit component. A dissolving compound in solid form may be disposed in the cavity. The dissolving compound in solid form is able to be sublimated to a gaseous dissolving compound upon an application of heat sufficient to raise a temperature of the solid dissolving compound to the sublimation temperature. A heater component may be incorporated for heating the dissolving compound to the sublimation temperature. A triggering mechanism may be used which has a portion which hermetically seals the cavity with the solid dissolving compound inside the cavity. The portion is adapted to be ablated in response to a triggering signal to thus open the cavity and enable release of the gaseous dissolving compound therefrom. The gaseous dissolving compound acts to dissolve at least a portion of the integrated circuit component and to destroy a functionality of the integrated circuit component.

In another aspect the present disclosure relates to a method for rapidly destroying a functionality of an integrated circuit component. The method may comprise positioning a module in proximity to the integrated circuit component. The method may also involve housing a solid dissolving compound within a housing of the module, the dissolving compound able to be sublimated to a gaseous dissolving compound upon being heated to a sublimation temperature. The method may further involve applying a signal to a heating component to heat the solid dissolving compound to the sublimation temperature to create a gaseous dissolving compound. The gaseous dissolving compound may be used to dissolve at least a portion of the integrated circuit component to thus destroy its functionality.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way. In the drawings:

FIG. 2 is a table showing a comparison of transient properties of materials used in traditional integrated circuits;

FIG. 4 is a table setting forth various types of electrical or electronic components that may be manufactured using the teachings of the present disclosure;

FIG. 7 is a table showing the chemical equations that may be used to help determine the amount of xenon difluoride required to etch given amounts of different semiconductor materials;

FIGS. 9a-9g show how the xenon difluoride module of FIG. 3 may be manufactured in two halves;

DETAILED DESCRIPTION

Figure 1:
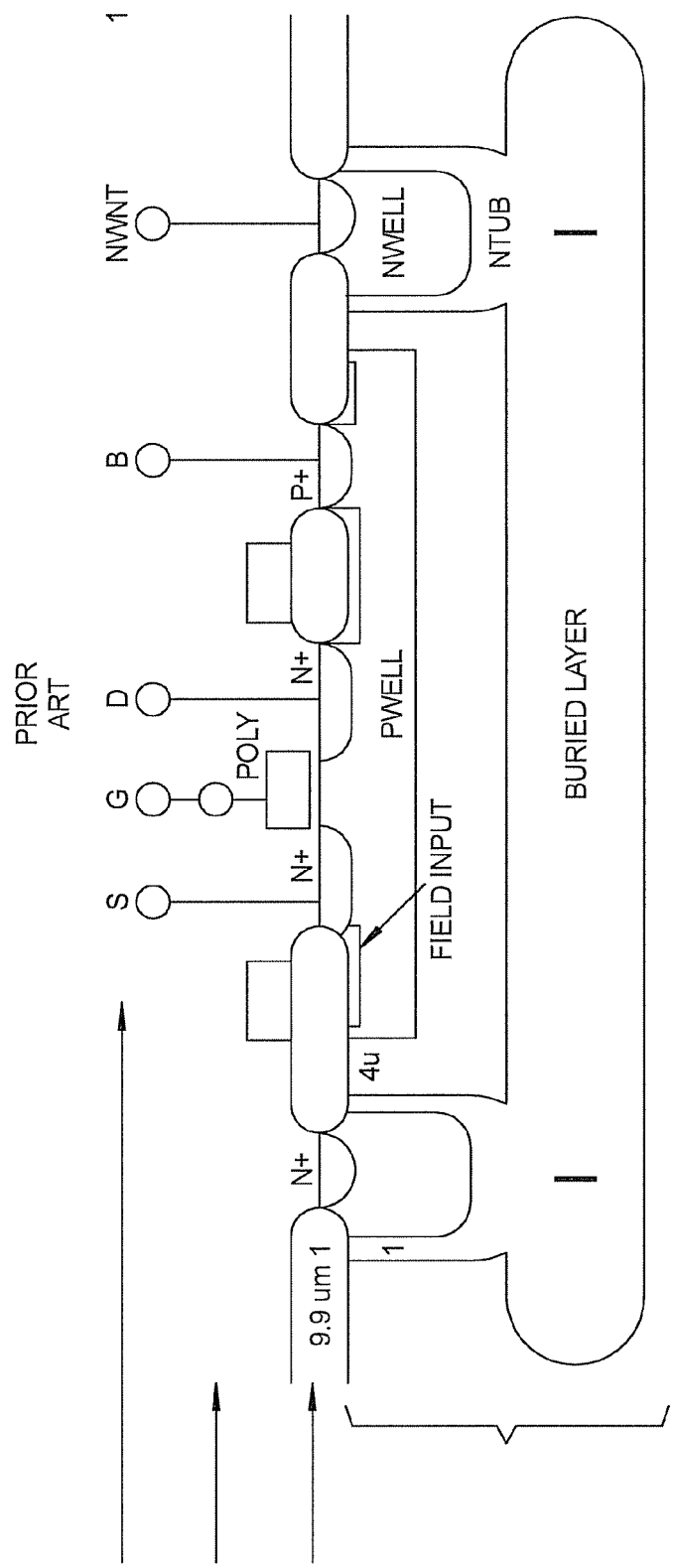
FIG. 1 is a cross sectional view of a prior art nmos transistor showing its passivation layers and metal interconnects.

The following description is merely exemplary in nature and is not intended to limit the present disclosure, application, or uses. It should be understood that throughout the drawings, corresponding reference numerals indicate like or corresponding parts and features.

The present disclosure recognizes and makes use of xenon difluoride as an effective compound for etching silicon, and thus fully or partially dissolving a semiconductor circuit to destroy its functionality. Xenon difluoride is a gas-phase, room temperature isotropic etchant which etches silicon without a plasma as fast as 100 micrometers per minute at room temperature. Xenon difluoride is a member of a family of fluorine based silicon etchants which includes ClF3, BrF3, BrF5 and IF5. All of these fluorine based compounds can be used for vapor-phase chemical etching of silicon. Xenon difluoride has been found to have high etch rates for silicon and will readily etch silicon at room temperature. Furthermore, xenon difluoride requires no external energy sources to ionize the gas to etch silicon. Xenon difluoride is a white solid at room temperature and pressure, and it is available from most major chemical vendors such as Air Products and Chemicals, Inc., of Allentown, Pa., and Pelchem SOC Ltd., of Pietoria, South Africa. Using standard chemical personal protective equipment, xenon difluoride crystals can be handled safely. Rather than melting at elevated temperatures, xenon difluoride sublimates at 114° C. at atmospheric pressure and it has a sublimation pressure of about 3.9 Torr at room temperature. Xenon difluoride etches silicon by first adsorbing to the surface and then dissociating to xenon (Xe) and fluorine (F). Fluorine is the main etchant in the silicon etching process.

The reaction for silicon with xenon difluoride is $2XeF_2 + Si. \rightarrow 2\ Xe + SiF_4$. The reaction is exothermic and substrate temperature increases by tens to hundreds of degrees have been observed on samples. It has been used to etch silicon in the MEMS industry for over 15 years, and equipment is available commercially to fabricate MEMS structures from companies such as Xactix Inc., of Pittsburgh, Pa.

Fortunately, xenon difluoride also etches other materials including germanium, molybdenum, titanium, tungsten, and other dielectrics such as silicon nitride and silicon rich silicon nitride. Silicon nitride has a higher dielectric constant than silicon dioxide (7.5 vs. 3.9) and similar dielectric strength (about 107 V/cm), which makes it a substantially equivalent passivation material to silicon dioxide, if not better. The performance of the integrated circuits will not be affected by the substitution of silicon oxide with silicon nitride. Etch rates as high as 150 nm/min at room temperature can be achieved for stoichiometric silicon nitride and even faster for silicon rich silicon nitride. The etch rate of silicon nitride in xenon difluoride increases as the temperature of the substrate increases. Tungsten has a resistivity of $5.6 \times 10^{-6}$ cm which is less than four times copper's resistivity ($1.68 \times 10^{-6}$ cm). The design rules of the semiconductor process can be modified to increase the width and the thickness to match the resistance of traditional copper and aluminum metallization. Hence, the performance of the integrated circuits will not be affected by the substitution of copper with tungsten. The etch rate of tungsten in xenon difluoride is reported to be extremely fast, much faster than silicon.

The table of FIG. 2 lists typical materials used in commercial off-the-shelf integrated circuit technology, and their transient ability in xenon difluoride. Assuming a silicon substrate thickness of 250 μm, over 90% of traditional integrated circuit technology is transient in xenon difluoride. By "transient" it is meant able to rapidly dissolved. By replacing the materials shown in FIG. 2 with transient materials, there will be no visible sign of the integrated circuit after it is exposed to xenon difluoride. Hence, high performance transient electronics which are not currently available are realizable using xenon difluoride gas since present day commercial semiconductor technology processes can be utilized.

Figure 3:
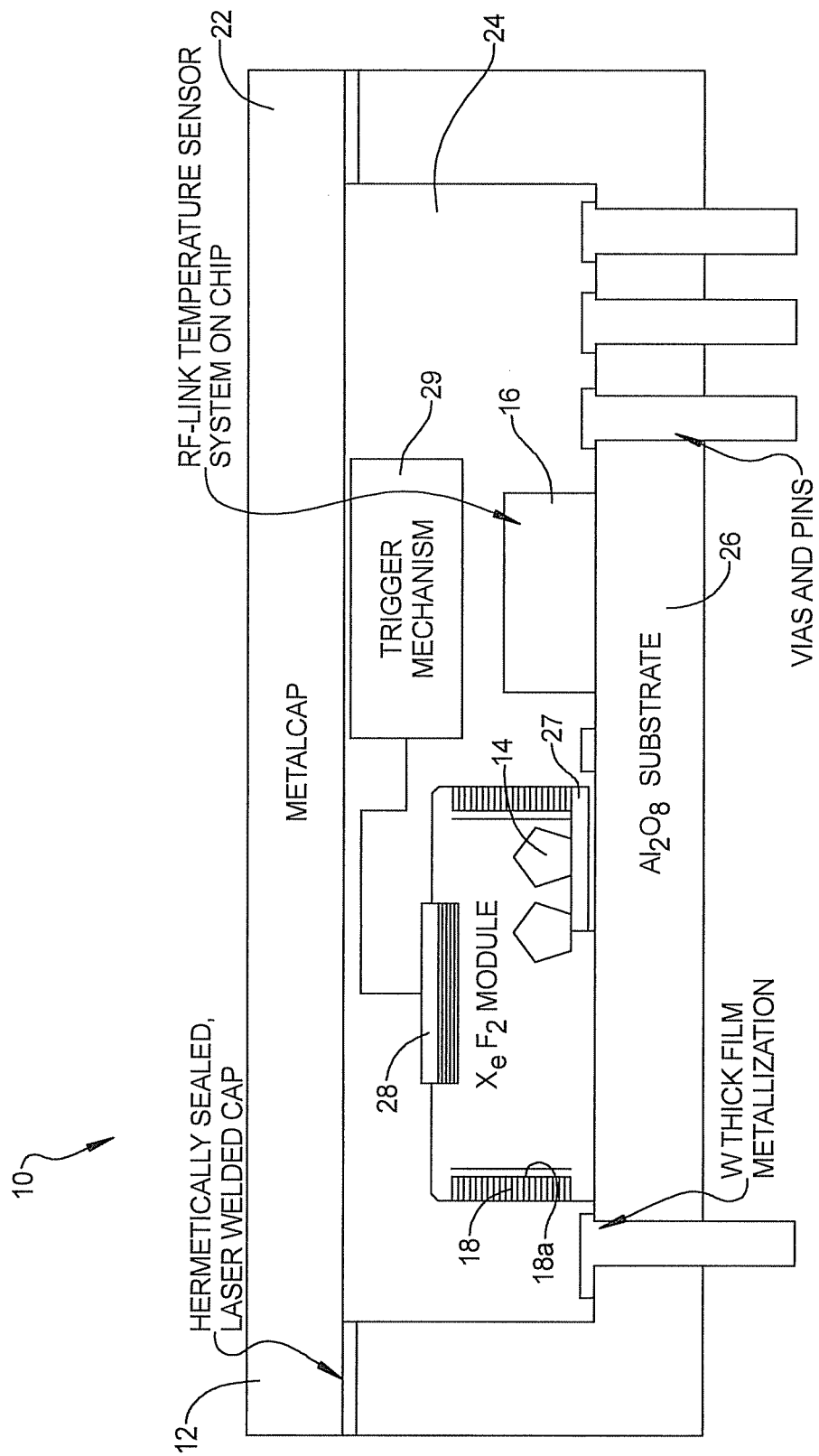
FIG. 3 is a high level side view of a packaged integrated circuit module in accordance with one embodiment of the present disclosure.

Referring to FIG. 3, one embodiment of a packaged, integrated circuit system 10 in accordance with the present disclosure is shown. In order to accomplish the objective of transient electronics, a sealed module 12 having a housing 12a containing one or more xenon difluoride crystals 14 may be packaged and co-located on a substrate 26 in proximity to an integrated circuit component 16. The module 12 containing the xenon difluoride crystals 14 may be fabricated out of silicon or another suitable material to form an interior wall 18 that substantially encloses the xenon difluoride crystals. An industry standard package may be used to contain the integrated circuit component 16 and the xenon difluoride module 12. The industry standard package may include a substrate wall structure 20 secured to the substrate 26 along with a hermetically sealed, laser welded metal cap 22. The substrate 26, wall structure 20 and metal cap 22 may be used together to form a hermetically sealed chamber or cavity 24. The sealed module 12 is thus disposed within the hermetically sealed cavity 24. The integrated circuit component 16, which in one application may comprise an RF-link temperature sensor in the form of an application specific integrated circuit (ASIC), may also be mounted on the substrate 26 and thus disposed within the cavity 24. The interior wall 18 of the module 12 may also be coated with a thin layer of gold 18a to prevent the xenon difluoride crystals 14 from attacking the sealed module 12 from its inside.

In order to make all or a portion of the integrated circuit component 16 vanish, a trigger mechanism 29, formed in part by a membrane 28 on the module 12, may be provided, which operates like a fuse. The trigger mechanism 29 may include a suitable electric switch for controlling the application of an electrical current to the membrane 28. The trigger mechanism 29 may be used to receive a wired signal or possibly a wireless signal which commands the trigger mechanism to apply the current to the membrane 28 to start heating (i.e., burning) the membrane. Burning the membrane 28 causes it to ablate, which exposes the interior area of the module 12, and thus the xenon difluoride, to the integrated circuit component 16. Also at this time a heater, which in one form may be a resistive microheater 27, may be fabricated as part of the module 12 and used to heat the xenon difluoride crystals 14 above their sublimation temperature. The microheater 27 may take the form of a conductor, such as a length of copper wire or a copper trace, that may be used to heat the xenon difluoride crystals 14 to their sublimation temperature when a suitable electric current is applied to the microheater 27. Alternatively, it is possible that a form of "hot plate" may be formed by one or more pieces of electrically conductive material upon which the module 12 may be positioned, and the hot plate heated by an application of electric current thereto. Accordingly, it will be appreciated that a plurality of different methodologies may be used to heat the xenon difluoride crystals 14.

When the xenon difluoride crystals 14 reach their sublimation temperature sublimation occurs, and the crystals are transformed into xenon difluoride gas which fills the inside of the module 12 housing 12a. When the trigger mechanism is activated and the membrane 28 is ablated, the xenon difluoride gas escapes from the module and then etches the material contained within the integrated circuit component 16. The integrated circuit component 16 may contain silicon, silicon nitride, and the tungsten, which are all susceptible to being dissolved by the gaseous xenon difluoride, and which will all be completely or substantially rapidly dissolved by the gaseous xenon difluoride. In one embodiment the housing 12a of the module 12 is also made from silicon, so it too will be dissolved by the gaseous xenon difluoride. All of these materials are transient in the presence of gaseous xenon difluoride.

Since the xenon difluoride is an exothermic reaction ($1.4 \times 10^6$ J/(mol of Si etched)), the heat generated during the etch process will sustain the sublimation of the xenon difluoride and increase the etch rate of the materials in the integrated circuit component 16. The etch rate of these materials (i.e., silicon, silicon nitride and tungsten) may be controlled by a topology and a geometry of the substrate (i.e., the integrated circuit component 16). The more exposed surface area of the integrated circuit component 16, the faster the kinetics of the material being etched. Further, once the integrated circuit component 16 and the xenon difluoride module 12 have vanished, the xenon difluoride reaction will terminate.

It will be appreciated that basic transient electronics devices such as nmos and pmos transistors, resistors, capacitors and inductors may be designed, fabricated and included as part of the packaged integrated circuit system 10. These devices may be manufactured such that they only contain silicon, silicon nitride and tungsten, which are all transient materials when exposed to xenon difluoride gas. A significant advantage is that these basic transient electronic devices may be fabricated using presently commercially available semiconductor processes but without the typical passivation and metallization. The passivation process may involve using silicon nitride and the metal interconnect layer may use tungsten. Once these devices are manufactured, their electrical performance may be characterized and compared to standard devices and components produced. Further, once these devices have been fabricated, their transient properties may be characterized and optimized in the presence of xenon difluoride gas.

FIG. 4 is a table setting forth various electrical and electronic components/subsystems that may be manufactured using the teachings of the present disclosure. It is anticipated that certain changes in cross-section and design rules may need to be considered as a result of material modification. For example, tungsten ($5.6 \times 10^{-8}$ m) has a higher resistivity than the Al—Cu alloy ($2.7 \times 10^{-8}$ m). As a result, a manufacturing process may be modified to deposit a greater thickness of tungsten metallization, and the design rules may be adjusted to increase minimum trace widths. Another consideration is that $Si_3N_4$ has a greater dielectric constant than $SiO_2$. This will result in a different thickness of the interlayer dielectrics being selected in order to reduce crosstalk or parasitic capacitance. Nevertheless, it is expected that the same high performance semiconductor device function may be achieved using the materials and manufacturing considerations explained above as those high performance semiconductors manufactured by present day semiconductor device manufacturers.

Figure 5:
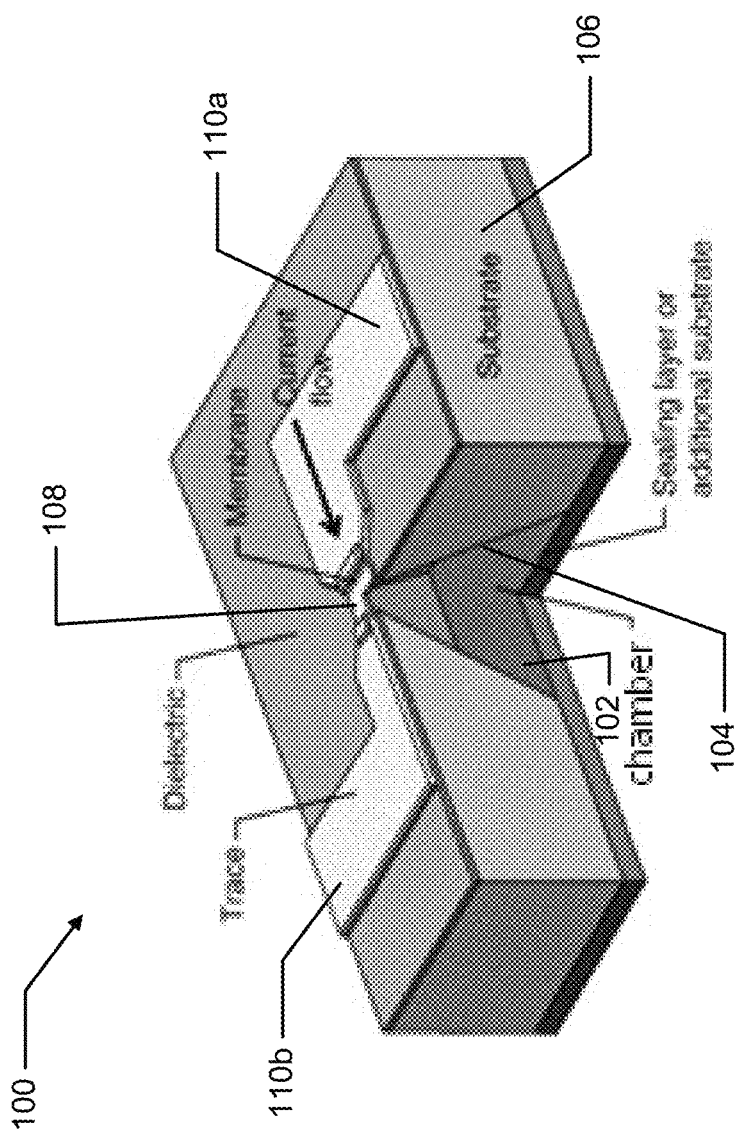
FIG. 5 is a more detailed perspective view of a sealed xenon difluoride module in accordance with another embodiment of the present disclosure.
Figures 6A, 6B, 6C:
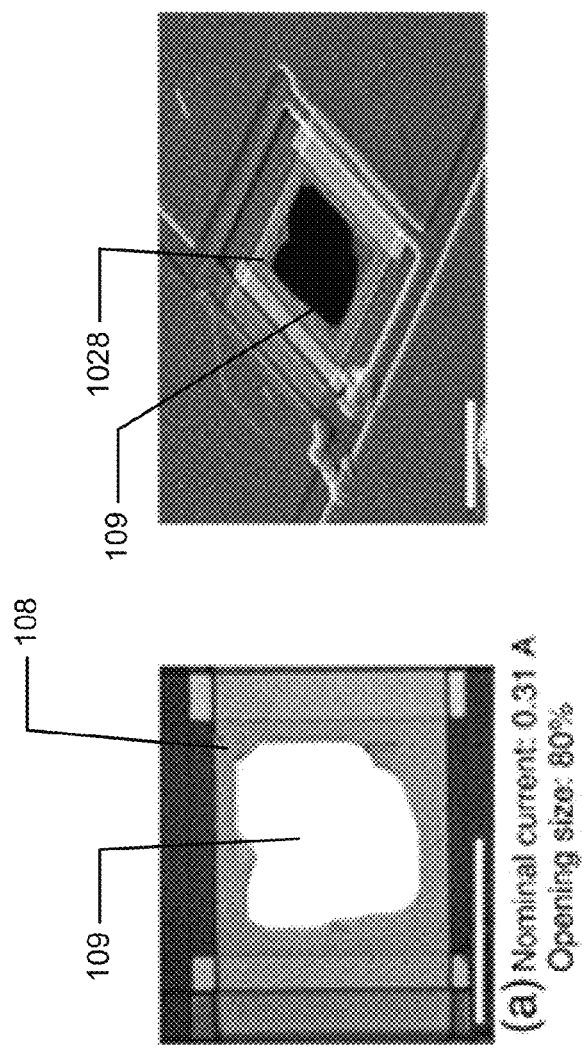
FIGS. 6a and 6b illustrate an opening in the membrane of the module of FIG. 5 after ablation.
FIG. 6c illustrates a graph showing one example of a current flow versus time that may be used to ablate the membrane of the module of FIG. 5.

FIG. 5 is a more detailed perspective view of a sealed xenon difluoride module 100 in accordance with another embodiment of the present disclosure illustrating one manner in which a trigger mechanism may be integrated into the module 100. Transience is achieved by corroding the electronics using xenon difluoride gas. Solid xenon difluoride 102 is stored in in a hermetically-sealed chamber 104 within a substrate 106. The solid xenon difluoride 102 remains in a solid state until a trigger mechanism sublimates the xenon difluoride and opens the chamber 104 so that the xenon difluoride gas can flow out and corrode the electronics formed on the substrate 106. The trigger mechanism in this example is formed using a thin metal membrane 108 made from a suitable metal, for example tungsten, that forms a seal to cover an opening to the chamber 104. The metal membrane 108 may be ablated through resistive heating and may have a thickness in the range of about 10 nanometers-10 micrometers. The membrane 108 is in communication with portions 110a and 110b of a trace 110 which may carry a current of predetermined magnitude, for example about 0.31 A. When such a current is passed through the membrane 108 this causes rapid, localized heating of the membrane 108 which causes it to quickly ablate, typically in less than about 5 seconds. Preferably, the module 100 will be optimized so that the current passed through the membrane 108 causes sufficient localized heating to heat the solid xenon difluoride to a temperature of about 114° C., which is the temperature at which $XeF_2$ sublimates at atmospheric pressure. The hermetically sealed chamber 104 will thus be heated to a temperature sufficient to cause sublimation of the solid xenon difluoride to a gaseous form, and ablation of the membrane 108 enables the on-demand release of the xenon difluoride gas through the electrothermal ablation of the hermetic seal, which in turn causes rapid corrosion and dissolution of the substrate 106 and any integrated circuit components in its proximity. The opening 109 in the membrane 108 after ablation is shown in FIGS. 6a and 6b. FIG. 6c illustrates a graph showing one example of a current flow that may be used to ablate the membrane 108. It will be appreciated that optimization of the ablation process and dissolution of the substrate 106 may involve various considerations relating to the seal materials used, thicknesses, dimensions, fabrication processes, and the electrothermal ablation power used.

The dissolution rate of the electronic components formed on the substrate 106 may be optimized through various approaches and considerations.

For example, the silicon chips which contain the electronic devices may be thinned down to 30-150 μm to minimize the volume of silicon that needs to be dissolved. The silicon chips can be thinned down even further to minimize the volume of silicon and xenon difluoride and minimize the transient time required to achieve an acceptable percentage of dissolution. Even at 100 μm thick, the silicon substrate is over 90% of the volume to be etched.

Figure 8:
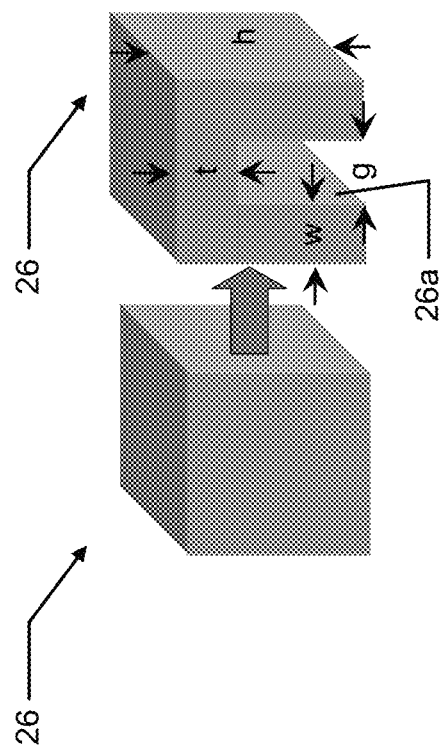
FIG. 8 shows how the surface area of a silicon section of material may be "patterned" to increase the surface area that may be acted on by the xenon difluoride.

In order to determine the mass and volume of xenon difluoride required to etch known volumes of silicon, silicon nitride and tungsten, the etching chemistry and chemical equations must be established. The resulting molar relationship between consumption of xenon difluoride and the target of interest (silicon, silicon nitride or tungsten) can then be used to calculate the mass and volume ratios of the reactants. Knowing the products, the chemical equations may then be balanced to determine the molar ratio between xenon difluoride and the targets. The mass and volume ratios may then be calculated using this relationship and are summarized in the table of FIG. 7. Using these relationships, the amount of $XeF_2$ required to etch a given mass or volume of silicon, silicon nitride and tungsten can be determined. For example, for a 1 cm×1 cm integrated circuit which is 100 μm thick, a crystal of xenon difluoride which is 1 cm×1 cm by ~650 μm thick is required since the volume of the silicon nitride requires less xenon difluoride and the volume of tungsten is less than 0.1% of the silicon. Hence, the integrated circuit volume can be estimated as a solid volume of silicon. In order to adjust the rate of dissolution of the integrated circuit component 16, the exposed surface area of the integrated circuit needs to be modified. In order to increase the dissolution rate, the exposed surface area of the materials may be increased. One method to increase the surface area is to pattern the backside of the silicon substrate 26. This "patterning" is illustrated in FIG. 8. This involves forming one or more trenches 26a in the substrate 26 to increase the surface area that will be exposed to the xenon difluoride gas, as well as to reduce the volume of silicon that must be dissolved. The design parameters involved are the thickness of the remaining silicon substrate (t), the width of the silicon posts remaining (w), the gap between silicon posts (g), and the thickness (h) of the original silicon substrate 26. The trench pattern 26a shown in FIG. 8 can be repeated in the orthogonal direction to produce a two dimensional grid pattern instead of the one dimension trench pattern shown in FIG. 8. Even more complex trench patterns can be constructed as well. The design constraint is maintaining the mechanical integrity of the silicon substrate so it can survive the packaging process and subsequent testing. It is anticipated that a grid pattern with g=w=250 μm in both directions, t=25 μm, and h=100 μm will produce a pattern which yields mechanically robust silicon substrates, although variations of these dimensions may also yield acceptable mechanical strength. Using the above-mentioned parameters, the volume of silicone may be reduced by about 42% and the exposed surface area increased by about 10%. Etch rates of xenon difluoride gas have shown to be up to 15 μm per minute using mixtures of xenon difluoride and nitrogen gas. The nitrogen gas may be used to reduce the etch rate of silicon as well as to reduce the temperature that the substrates are exposed to. As mentioned previously, the reaction between xenon difluoride and silicon, silicon nitride and tungsten is exothermic, releasing 1.4e6 J per mol of silicon etched. This causes significant heating of the substrate 26.

Referring to FIG. 9a-9g, the module 100 may be microfabricated in two halves that are subsequently bonded with the xenon difluoride crystal(s) placed within. This creates an opening or cavity with a hermetically sealed membrane that can be electrothermally ablated on-demand. Additionally, a non-corrodible chamber coating may be used inside the xenon difluoride module 100 to prevent accidental etching of the silicon under fluctuations in temperature during operation in field. FIG. 9a shows a block of silicon 150 that will be used to make one half of the xenon difluoride module 100. FIG. 9b shows the block of silicon 150 after being etched using a DRIE (Deep Reactive Ion Etching) process to create a cavity 152 defined by a perimeter wall 154, and where the perimeter wall includes a weld groove 154 that will be used for cold welding the two halves together. FIG. 9c shows a layer of metal 156, for example gold, that has been deposited on interior walls of the cavity 152 and the surfaces in and around the weld groove 154. The component shown in FIG. 9c thus forms one half 100a of the xenon difluoride module 100.

FIG. 9d shows a block of silicon material 160 that may be used to make the other half of the module 100. FIG. 9e shows how the block of material 160 may be patterned with a ridge of metal 162, for example gold, that will be used to help form a perimeter seal to seal off the cavity 152 when the two halves of the module 100 are assembled together. A section of metal 164, for example gold, may also be patterned on one surface of the block of material 160, and forms the membrane 108. The ridge of metal 162 essentially forms a ridge that extends around the perimeter of a surface 166 of the block of material 160. FIG. 9f shows a cavity 168 that has been formed in the block of material 160 for example by a DRIE process. FIG. 9g shows an opening 170 that has been formed (e.g., by a DRIE process) in the block of material 160, as well a layer of metal 172, for example gold, which has been deposited on the wall surfaces making up the cavity 168 and the surfaces adjacent the ridge of metal 162. The structure shown in FIG. 9g thus forms a second half 100b of the xenon difluoride module 100.

Figure 10B:
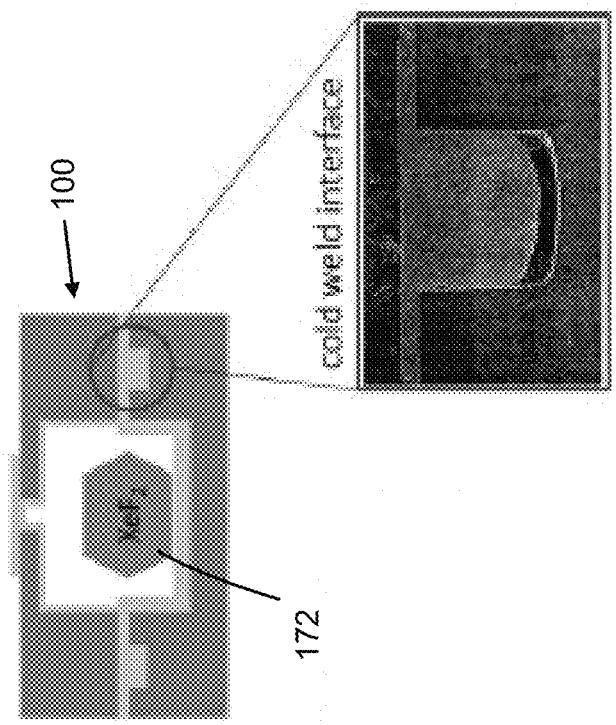
FIGS. 10a and 10b show how the two halves of the module may be secured together via a cold compression bonding technique.
Figure 10A:
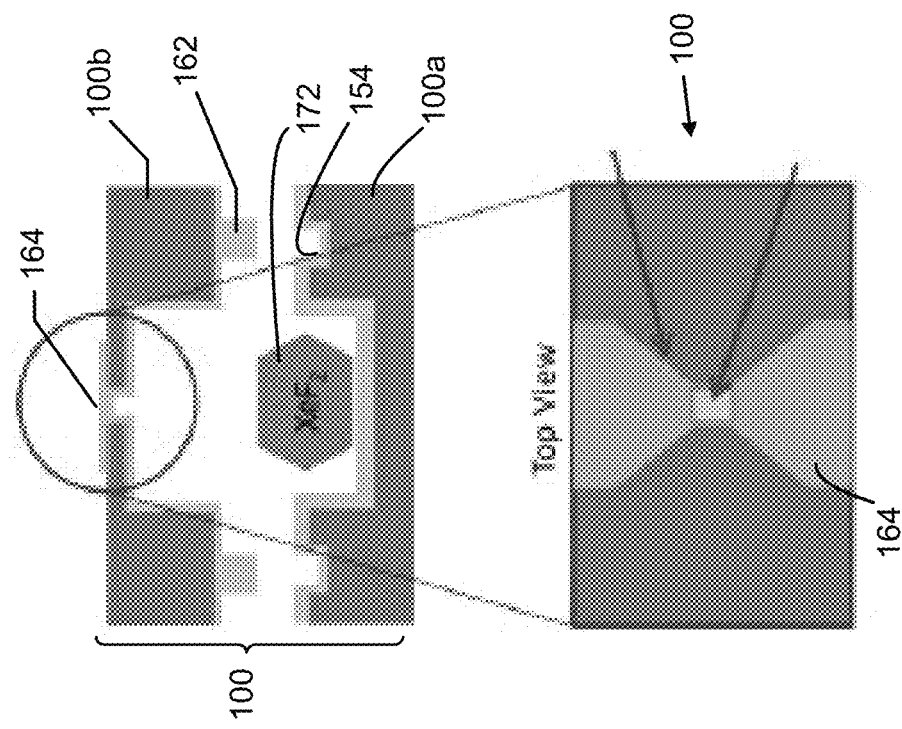

FIGS. 10a and 10b further illustrate how the hermetic sealing of the two halves 100a and 100b may be achieved using cold compression bonding after a xenon difluoride crystal (or crystals) 172 is placed within a chamber 174 formed by the two cavity areas 152/168. It will be appreciated that typical hermetic sealing processes for semiconductor devices are performed at temperatures typically over 300° C., which would sublimate the xenon difluoride crystal 172. A low temperature sealing approach eliminates this issue. Such a process is described in U.S. Patent Pub. No. 20120241216 to Coppeta et al., entitled "Compression and Cold Weld Sealing Methods and Devices", assigned to MicroCHIPS™, Inc., of Lexington, Mass., the disclosure of which is hereby incorporated by reference into the present disclosure. The low temperature sealing approach may involve cold compression sealing (i.e., bonding) using a flip-chip bonder that is capable of applying forces up to 100 kg-f at 0.5 μm alignment accuracy. Hermeticity may be quantified by placing a sealed module into a high-pressure helium vessel, followed by spectroscopic measurement of leaking gas with a helium leak detector. The packaged xenon difluoride module 100 may be assembled on top of the microheater system described in connection with FIG. 3. Heat from the microheater system may conduct through the highly thermally conductive silicon base of the xenon difluoride module 100 to ensure full sublimation of the xenon difluoride crystal 172 prior to ablating the membrane 164.

Figure 11:
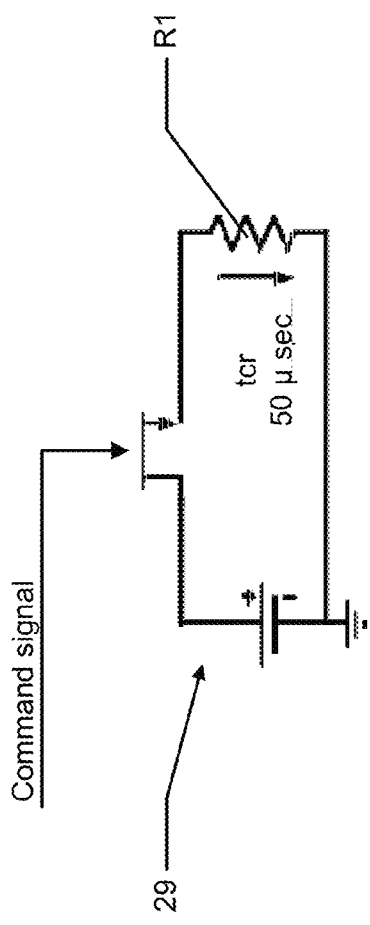
FIG. 11 is a simplified circuit diagram of a triggering mechanism that may be used to ablate the membrane shown in FIG. 3.

Since the gas-releasing membrane 108 (FIG. 5) is destroyed by the heat which is generated by the current through the membrane itself, it is strongly preferable to supply high peak current through the membrane. Previous testing indicates when the membrane 108 is constructed with layers of titanium, platinum and titanium (Ti/Pt/Ti), that a current level of about 0.5 A-1.0 A should flow through the membrane for a time period of about 50 μsec. The resistance of a Ti/Pt/Ti membrane 108 is about 1.5Ω. The instantaneous power consumption during the first 50 μsec is then I2R=0.72×1.5=735 mW. Although this power consumption seems to be high, it is needed only for the 50 μsec or shorter time interval. Therefore, the required power for the self-etching gas release is not high. The current can be supplied by a circuit such as shown in FIG. 11. The energy efficiency for membrane rupture can be defined as RM/(RM+R1) where R1 is the parasitic resistance of M1 transistor. Therefore, the material for the membrane 108 should have high resistivity compared to the parasitic resistance of a MOSFET. In addition, it is preferable to supply a high current level (about 0.5-1 A) in order to guarantee the rapid rupture of the membrane 108 with high probability. It is easy to achieve ~1Ω resistance for MOSFET switches. Therefore, the total resistance of switch and membrane 108 can be designed smaller than 3Ω, which enables the current of more than 1 A under the 3.3V supply. Once the membrane 108 is fully ruptured, the current path is broken and no more current will flow through the membrane.

It is anticipated that the teachings of the present disclosure will be well suited to manufacturing various types of highly complex integrated circuits. One anticipated application is using the teachings presented herein to form an RF-linked temperature sensor that is able to be dissolved upon the sensor receiving either a wired signal or a wireless signal that activates the trigger mechanism of the xenon difluoride module 12 or 100 to begin the dissolution action. It will be appreciated that the teachings discussed herein could be utilized to construct a wide variety of other integrated circuit based devices and components, where rapid dissolution of the component can be initiated via a wired or a wireless command to the triggering mechanism of the module 12 or 100.

Figure 12:
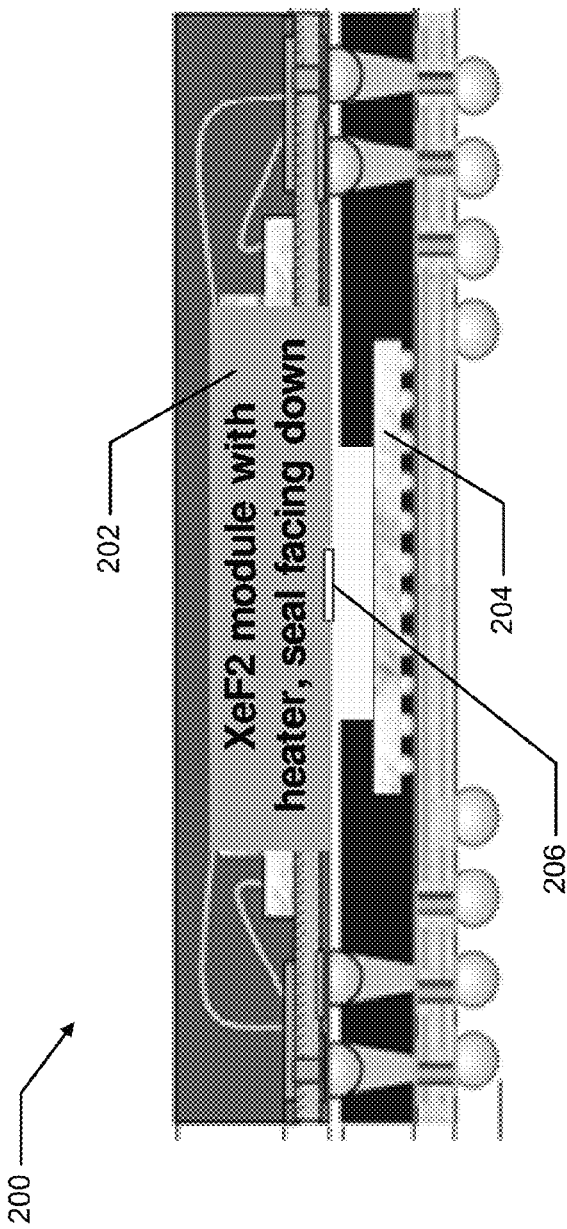
FIG. 12 is a high level side view block diagram of another embodiment in which the xenon difluoride module is packaged on top of the IC component in accordance with conventional semiconductor manufacturing practices.

Referring to FIG. 12, another packaged integrated circuit (IC) module 200 of the present disclosure is shown. However, with the module 200, a xenon difluoride module 202, which may be similar or identical to the modules 12 and 100 in construction, is placed on top of an integrated circuit component 204 that is to be dissolved by the xenon difluoride module 202. In this embodiment a membrane seal 206 of the xenon difluoride module 202 may be placed facing downwardly toward the integrated circuit component 204. Thus, the xenon difluoride module 202 may be placed into standard semiconductor industry packages and stacked. Essentially, this enables the packaged IC module 200 to be manufactured in a manner which is fully compatible with existing commercial IC manufacturing processes and circuit design methods.

Figure 13:
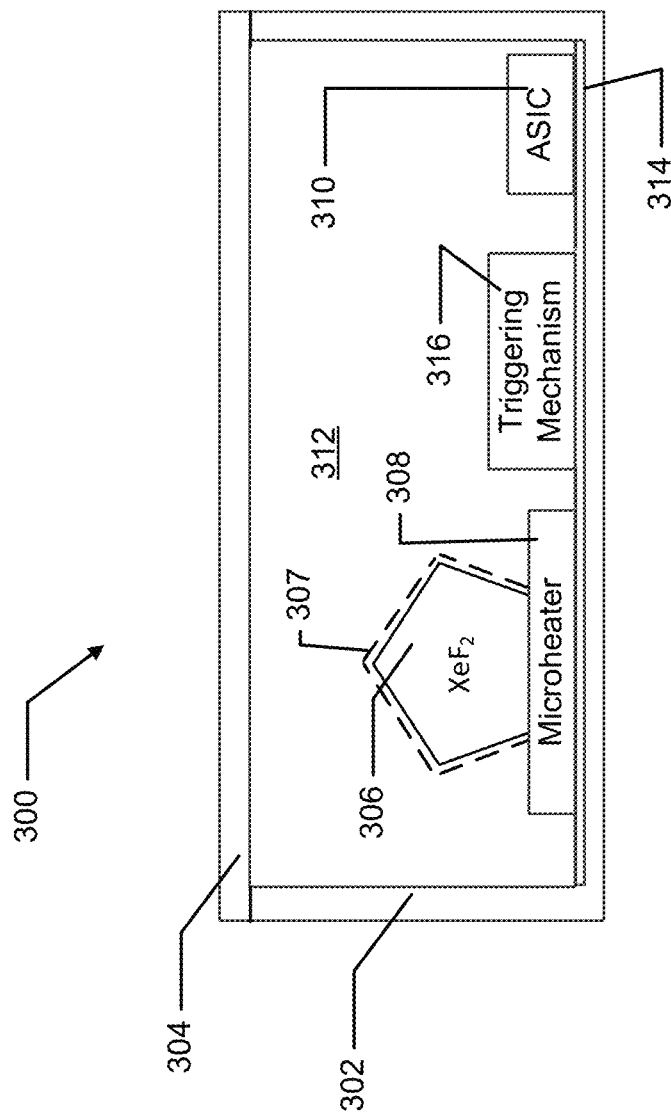
FIG. 13 is a high level side view block diagram of another embodiment of the present disclosure in which the xenon difluoride crystals are not contained in a separate housing, but are rather co-located in a common housing with the IC component, thus eliminating the need for an ablatable membrane.

Referring to FIG. 13, still another packaged integrated circuit module 300 is shown in accordance with another embodiment of the present disclosure. In this embodiment a hermetically sealed housing 302 includes a cap 304 to define a volume 312 there within. The volume 312 houses an integrated circuit 310 which resides on a substrate 314. A microheater 308, which in this example forms a hot plate, which may be similar or identical to the hot plate described in connection with the module 10 of FIG. 3, is used to support one or more xenon difluoride crystals 306 thereon. The one or more xenon difluoride crystals 306 are in close proximity to the ASIC 310 (typically within about 100 micrometer-100 mm or so. The volume 312 may be pressurized so as to modify, that is raise, the temperature at which sublimation of the xenon difluoride crystals 306 occurs within the volume 312. When the microheater 308 receives a suitable wired or wireless command signal, a trigger mechanism 316 within the housing 302, which may be the same or similar to the triggering mechanism described for the packaged IC system 10, may be used to apply a current to the microheater 308 to begin heating the one or more xenon difluoride crystals 306 to the sublimation temperature. In this manner no separate membrane is required for use. Essentially, as soon as the xenon difluoride crystal or crystals 306 reach the sublimation temperature, sublimation will occur and the created xenon difluoride gas will immediately begin dissolving one or more material layers of the ASIC 310 to destroy functionality of the ASIC, or to dissolve it entirely. Thus, by pressurizing the volume 312 and raising the sublimation temperature, one can ensure that sublimation does not begin occurring when the module 300 reaches its normal operating temperature or is even slightly above its normal sublimation temperature (i.e., its sublimation temperature at normal atmospheric pressure).

It will also be appreciated that another embodiment that does not require an ablatable membrane could be implemented as a suitable coating on the XeF2 crystal 306, which is indicated by dashed line 307 in FIG. 13, which melts at a desired temperature. The material coating 307 is selected so that it melts at a much higher temperature than XeF2. This would eliminate the need for an ablatable membrane, as well as the need to hermetically seal and pressurize the housing 302. The melting temperature of the coating material 307 is also selected (i.e., tuned) to be above the safe operating temperature of the electronics (and also the requirements of military specifications for temperature). In this embodiment the microheater 308 would simply heat the coated-XeF2 above a certain temperature, for example 300 C, at which point the coating would degrade and the XeF2 would sublimate and start corroding the electronics.

It will also be appreciated that while the various embodiments described herein are described as being able to "dissolve" an integrated circuit in proximity to the module 12 or 100, that in actual practice it will most likely not be necessary to fully dissolve all of the various layers of material of the integrated circuit component 16 to destroy the circuit's functionality. A principal object of the present disclosure is to rapidly destroy the functionality of an integrated circuit, and this can be accomplished merely by destroying one or more material layer portions of the integrated circuit component 16, without the need to completely physically dissolve it. It will also be appreciated that instead of a module that uses a membrane, another way to keep the XeF2 protected is to form the membrane as a material coating that fully coats the XeF2. In this embodiment, however, the material coating comprises a material that melts at a much higher temperature than XeF2. This would eliminate the need for an ablatable membrane and module. Instead, the melting temperature of the coating material is tuned to be above the safe operating temperature of the electronics (and also the requirements of military specifications for temperature). In this implementation, a microheater would simply heat the coated-XeF2 above a certain temperature, for example 300 C, at which point the coating would degrade and the XeF2 would sublimate and start corroding the electro. It will also be appreciated that instead of a module that uses a membrane, another way to keep the XeF2 protected is to form the membrane as a material coating that fully coats the XeF2. In this embodiment, however, the material coating comprises a material that melts at a much higher temperature than XeF2. This would eliminate the need for an ablatable membrane and module. Instead, the melting temperature of the coating material is tuned to be above the safe operating temperature of the electronics (and also the requirements of military specifications for temperature). In this implementation, a microheater would simply heat the coated-XeF2 above a certain temperature, for example 300 C, at which point the coating would degrade and the XeF2 would sublimate and start corroding the electronics.

It will also be appreciated that some present day integrated circuits have materials, for example silicon dioxide and aluminum/copper, which do not corrode or dissolve in $XeF_2$. The present disclosure recognizes that these materials in the integrated circuits may be changed to silicon nitride or doped-glass (instead of silicon dioxide) and tungsten, or any other material that is compatible with $XeF_2$. The present disclosure also recognizes that since aluminum does not dissolve or corrode when exposed to $XeF_2$, that one could intentionally use aluminum as a barrier for the gaseous $XeF_2$. For example, aluminum could be used as a metal for coating the cavity in which the $XeF_2$ crystal is disposed, or as a metal to seal/protect certain parts that one does not want to destroy.

Still further, it will be appreciated that while silicon nitride has been discussed as an especially effective transient material, that using doped-glass as a transient insulating material is also expected to be effective in connection with the present system and method. In particular, the use of a custom doped glass that can be 'spun on' to the wafer, similar to other state-of-art insulators, may be used in place of silicon nitride. However, in this case, the composition may be specifically tuned using dopants which make it corrodable in XeF2. The glass may be doped with metallic or non-metallic components.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. An integrated circuit system having an integrated circuit component which is able to have its functionality destroyed upon receiving a command signal, the system comprising:
   a substrate;
   the integrated circuit component being supported on the substrate;
   a module disposed in proximity to the integrated circuit component, the module including:
      a cavity;
      a dissolving compound in a solid form disposed in the cavity;
      a heater component configured to heat the dissolving compound to a point of sublimation where the dissolving compound changes from a solid to a gaseous dissolving compound; and
      a triggering mechanism for initiating a dissolution process whereby the gaseous dissolving compound is allowed to attack the integrated circuit component and destroy a functionality of the integrated circuit component.

2. The system of claim 1, wherein the triggering mechanism includes a membrane which hermetically seals the cavity with the dissolving compound inside the cavity, the membrane configured to allow a current therethrough and to be resistively heated to a point of being ablated in response to the current flowing therethrough, to thus open the cavity to release the gaseous dissolving compound therefrom, which then at least partially dissolves the integrated circuit component to destroy functionality of the integrated circuit component.

3. The integrated circuit of claim 2, wherein the membrane is ablated within about 50 microseconds when a current within a range of about 0.5 amp to about 1.0 amp is flowed through the membrane.

4. The system of claim 1, wherein the triggering mechanism is used to initiate heating of the heater component to cause sublimation of the solid dissolving compound to a gaseous dissolving compound.

5. The integrated circuit system of claim 1, wherein the dissolving compound comprises xenon difluoride.

6. The integrated circuit system of claim 5, wherein the xenon difluoride in solid form comprises at least one xenon difluoride crystal.

7. The integrated circuit system of claim 1, wherein the heater component comprises at least one of:
   a wire for receiving an electric current; and
   a hot plate structure upon which the module is disposed and which receives an electric current.

8. The integrated circuit system of claim 1, wherein the integrated circuit component includes at least one of:
   silicon;
   germanium;
   molybdenum;
   titanium;
   tungsten;
   copper;
   aluminum;
   silicon oxide;
   silicon nitride;
   gold;
   aluminum oxide; and
   Doped glass.

9. The integrated circuit system of claim 1, wherein the module is disposed on the substrate in proximity to the integrated circuit, and wherein the module and integrated circuit are enclosed within a hermetically sealed structure.

10. The integrated circuit system of claim 1, wherein the cavity of the module is formed in a block of silicon; and
   wherein the cavity is coated with a layer of metal.

11. The integrated circuit system of claim 1, wherein the integrated circuit component is formed with at least one trench to increase a surface area thereof that is exposed to the gaseous dissolving compound.

12. A module adapted for destroying a functionality of an integrated circuit component upon receipt of a command signal, the module comprising:
   a hermetically sealed housing having a cavity and being disposed in proximity to the integrated circuit component;
   a dissolving compound in solid form disposed in the cavity, the dissolving compound in solid form able to be sublimated to a gaseous dissolving compound upon an application of heat sufficient to raise a temperature of the solid dissolving compound to the sublimation temperature;
   a heater component for heating the dissolving compound to the sublimation temperature;
   a triggering mechanism having a portion which hermetically seals the cavity with the solid dissolving compound inside the cavity, the portion adapted to be ablated in response to a triggering signal, to thus open the cavity and enable release of the gaseous dissolving compound therefrom, with the gaseous dissolving compound acting to dissolve at least a portion of the integrated circuit component so as to destroy a functionality of the integrated circuit component.

13. The module of claim 12, wherein the solid dissolving compound comprises at least one crystal of xenon difluoride.

14. The module of claim 12, wherein the heater component comprises a metal element configured to flow a current therethrough to accomplish resistive heating of the solid dissolving compound to the sublimation temperature.

15. The module of claim 14, wherein at least a portion of the heater component is dissolvable by the dissolving compound.

16. The module of claim 12, wherein the triggering mechanism includes a metal membrane configured to be ablated in response to the triggering signal, and wherein the triggering signal is a current flow applied to the metal membrane.

17. The module of claim 12, wherein the housing of the module comprises silicon with the cavity being coated with a layer of gold or aluminum.

18. A method for rapidly destroying a functionality of an integrated circuit component, the method comprising:
   positioning a module in proximity to the integrated circuit component;
   housing a solid dissolving compound within a housing of the module, the dissolving compound able to be sublimated to a gaseous dissolving compound upon being heated to a sublimation temperature;
   applying a signal to a heating component to heat the solid dissolving compound to the sublimation temperature to create the gaseous dissolving compound; and
   using the gaseous dissolving compound to dissolve at least a portion of the integrated circuit component to thus destroy its functionality.

19. The method of claim 18, further comprising:
   positioning a membrane over an opening in the housing of the module so as to hermetically seal the housing of the module; and
   ablating the membrane to release the gaseous dissolving compound from the housing of the module.

20. The method of claim 18, wherein the operation of ablating the housing comprises applying an electrical signal to a trigger mechanism associated with the membrane, which causes an electrical current to be flowed through the membrane to ablate the membrane; and wherein the operation of housing a solid dissolving compound in the housing of the module cavity comprises housing at least one crystal of xenon difluoride in the housing of the module.

21. The method of claim 18, further comprising including the operation of using a metal within at least one part of one of the module or the integrated circuit component to act as a barrier, wherein the metal is not dissolvable when exposed to the gaseous dissolving compound, to thus prevent at least a portion of the module or the integrated circuit component from being dissolved by the gaseous dissolving compound.

22. An integrated circuit system having an integrated circuit component which is able to have its functionality destroyed upon receiving a command signal, the system comprising:
   a substrate;
   the integrated circuit component being supported on the substrate;
   a dissolving compound in a solid form disposed in proximity to the integrated circuit component;
   a coating covering the dissolving compound, the coating selected to be meltable at a desired temperature; and
   a heater which is configured to be triggered by the command signal to heat the coating to the desired temperature, thus melting coating and causing the dissolving compound to sublimate and attack the integrated circuit to destroy a functionality of the integrated circuit component.

* * * * *